(12) United States Patent
Isenberger et al.

(10) Patent No.: US 7,173,842 B2
(45) Date of Patent: Feb. 6, 2007

(54) METAL HEATER FOR IN SITU HEATING AND CRYSTALLIZATION OF FERROELECTRIC POLYMER MEMORY FILM

(75) Inventors: Mark S. Isenberger, Corrales, NM (US); Hitesh Windlass, Hillsboro, OR (US); Wayne K. Ford, Beaverton, OR (US); Carlton E Hanna, Marlborough, MA (US)

(73) Assignee: Intel Corporation, Santa Clara, CA (US)

( * ) Notice: Subject to any disclaimer, the term of this patent is extended or adjusted under 35 U.S.C. 154(b) by 99 days.

(21) Appl. No.: 10/816,260

(22) Filed: Mar. 31, 2004

(65) Prior Publication Data

US 2005/0224849 A1 Oct. 13, 2005

(51) Int. Cl.
*G11C 11/22* (2006.01)
(52) U.S. Cl. .................. 365/145; 365/151; 365/65; 365/117
(58) Field of Classification Search ................ 365/145, 365/117, 65, 151
See application file for complete search history.

(56) References Cited

U.S. PATENT DOCUMENTS

| 4,731,754 A | * | 3/1988 | Ogden et al. ............... 365/121 |
| 4,759,614 A | * | 7/1988 | Yokokura et al. ........... 349/134 |
| 6,143,366 A | * | 11/2000 | Lu ........................... 427/376.3 |
| 6,524,887 B2 | * | 2/2003 | Li et al. ..................... 438/106 |
| 6,750,138 B2 | * | 6/2004 | Matsunaga et al. ......... 438/623 |
| 6,952,017 B2 | * | 10/2005 | Li et al. ....................... 257/10 |
| 2003/0057557 A1 | * | 3/2003 | Matsunaga et al. ......... 257/758 |
| 2005/0106760 A1 | * | 5/2005 | Windlass et al. .............. 438/3 |

FOREIGN PATENT DOCUMENTS

| JP | 403201593 A | * | 9/1991 |
| JP | 403278071 A | * | 12/1991 |
| JP | 405221139 A | * | 8/1993 |

\* cited by examiner

*Primary Examiner*—Viet Q. Nguyen
(74) *Attorney, Agent, or Firm*—Blakely, Sokoloff, Taylor & Zafman LLP

(57) ABSTRACT

An embodiment of the invention provides an on-chip heating system to both initially anneal and revive cycle-fatigued polymer ferroelectric materials utilized in memory devices. By heating the polymer ferroelectric material above its Curie temperature, the polymer ferroelectric material can crystallize as it cools. As such, the ferroelectric properties of the polymer are enhanced and/or restored.

32 Claims, 6 Drawing Sheets

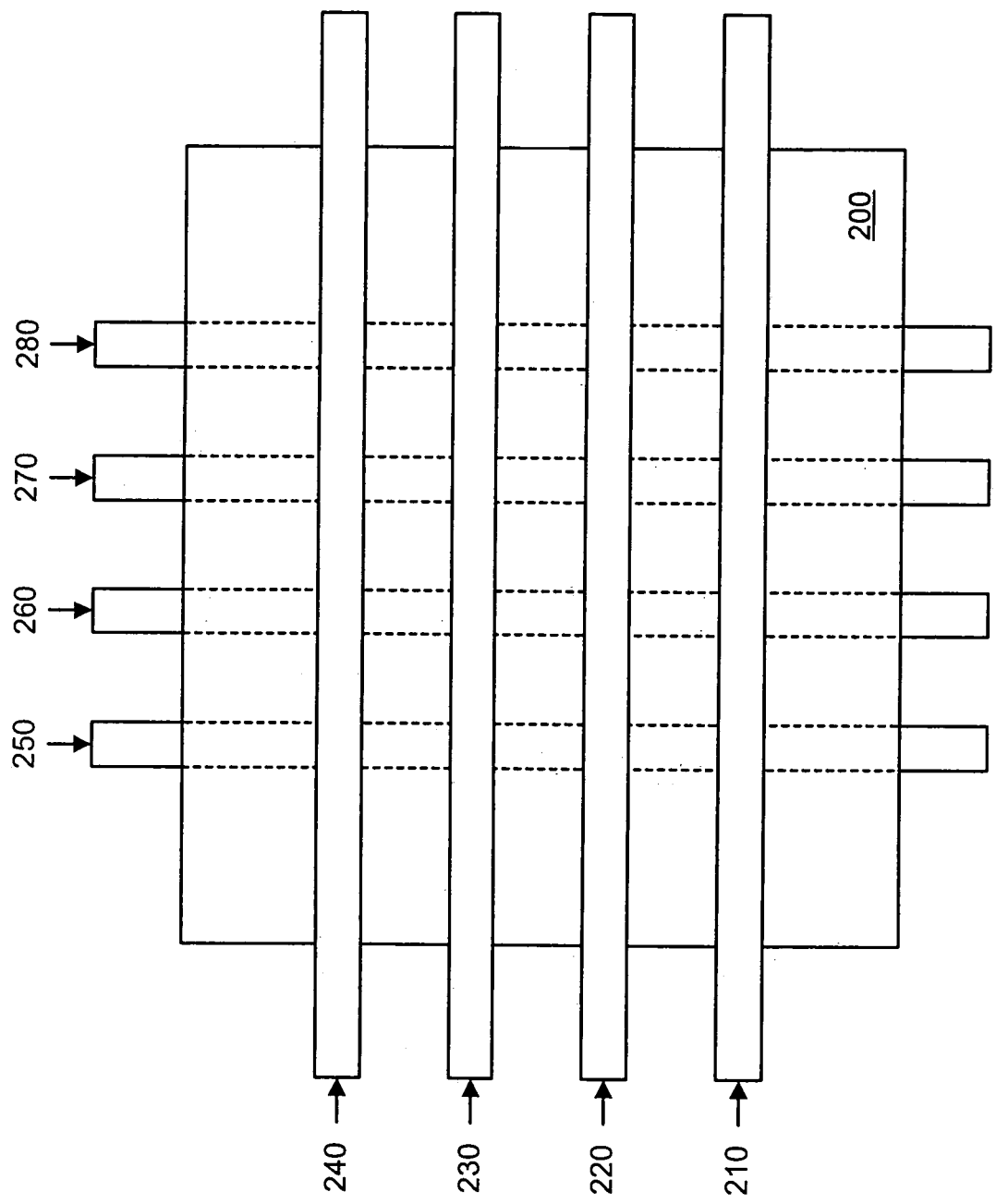

METAL HEATER FOR IN SITU HEATING AND CRYSTALLIZATION OF FERROELECTRIC POLYMER MEMORY FILM

FIELD

Embodiments of the invention relate to ferroelectric memory, and more specifically to extending the useful life of a ferroelectric memory device by reducing the loss of polarization due to ferroelectric material degradation.

BACKGROUND

Memory manufacturers are currently researching and developing the next generation of memory devices. One such development includes technology designed to replace current Flash non-volatile memory technology. Important elements of a Flash successor include compactness, low price, low voltage operation, non-volatility, high density, fast read and write cycles, and long life.

Current Flash technology is predicted to survive into 90 nanometer and 65 nanometer process generations. This survival is in part based on, for example, exotic storage dielectric material, cobalt and nickel source and drain regions, copper and low dielectric constant materials for the interconnect levels, and high dielectric constant materials for transistor gates. However, there will thereafter exist a need for new memory materials and technology, particularly for non-volatile memory.

Ferroelectric memory is one such technology aimed to replace Flash memory. A ferroelectric memory device combines the non-volatility of Flash memory with improved read and write speeds. Simply stated, ferroelectric memory devices rely on the use of ferroelectric materials that can be spontaneously polarized by an applied voltage or electric field and that maintain the polarization after the voltage or field has been removed. As such, a ferroelectric memory device can be programmed with a binary "1" or "0" depending on the orientation of the polarization. The state of the memory device can then be detected during a read cycle.

Two crystalline materials have emerged as promising films utilized in a ferroelectric memory scheme, namely lead zirconium titanate ("PZT") and strontium bismuth tantalite ("SBT"). However, while the materials exhibit appropriate ferroelectric properties, each is nevertheless expensive to integrate into an existing CMOS process flow.

More recent developments include the use of polymers that exhibit ferroelectric properties. The creation of polymer ferroelectric memory utilizes polymer chains with permanent ionic dipole moments. Data is stored by changing the polarization of the polymer chain between metal lines that sandwich the layer comprised of the ferroelectric polymer chain. Further, the layers can be stacked (e.g., metal word line, ferroelectric polymer, metal bit line, ferroelectric polymer, metal word line, etc.) to improve memory element density. The polymer ferroelectric memory devices exhibit microsecond initial read speeds coupled with write speeds comparable to Flash.

BRIEF DESCRIPTION OF THE DRAWINGS

FIG. 2: illustration of a top view of a polymer ferroelectric memory device.

DETAILED DESCRIPTION

Figure 1:
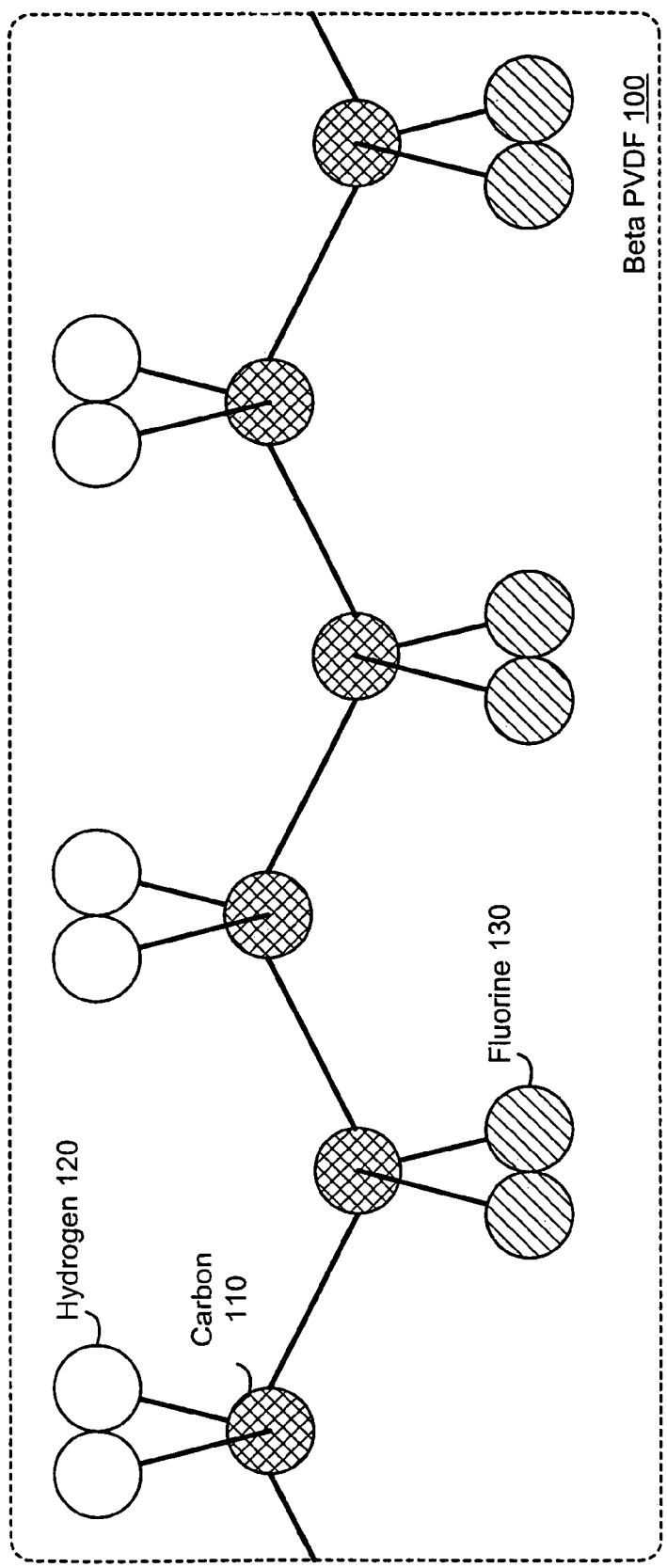
FIG. 1: illustration of a ferroelectric beta phase polyvinylidene fluoride (PVDF) molecule chain.

Embodiments of a metal heater for in situ heating and crystallization of ferroelectric polymer memory film are described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

An embodiment of the invention provides an on-chip heater to both initially anneal and revive cycle-fatigued polymer ferroelectric materials utilized in memory devices. By heating the polymer ferroelectric material above its ferroelectric Curie temperature, the polymer ferroelectric material can crystallize as it cools. As such, the ferroelectric properties of the polymer are enhanced and/or restored and the memory device containing the polymer ferroelectric material effectively resets its switching cycle threshold.

Ferroelectric materials exhibit a spontaneous (or permanent) ionic dipole moment, or polarization, in the absence of an external field. The spontaneous electric polarizations in ferroelectric materials result from relative displacements of negatively and positively charged ions with respect to symmetrical positions in the material's unit cell. In particular, the largest contribution to the permanent dipole moment are uncanceled electron affinities of different atoms and their tendency to remain in a preferred spatial orientation. The ferroelectric Curie temperature of a material is the temperature above which the spontaneous electric polarization vanishes. Above the ferroelectric Curie temperature, an otherwise ferroelectric phase or unit cell configuration of a material becomes a disordered paraelectric phase. Said differently, above the ferroelectric Curie temperature, a phase change occurs in the material that leads to the cancellation of the dipole moment between adjacent crystalline layers thereby dropping the preferred polarization to zero.

As noted, a large portion of the historical research in ferroelectric memory devices has centered around select crystalline materials such as PZT and SBT as introduced above. More current trends, however, include utilizing polymer chains that exhibit ferroelectric properties. Polyvinylidene fluoride ("PVDF") is a fluoropolymer with alternating $CH_2$ and $CF_2$ groups for which the relative electron densities between the hydrogen and fluorine atoms create a net electric polarization. FIG. 1 illustrates the ferroelectric beta phase PVDF 100, including a chain of carbon 110 and alternating and opposing hydrogen 120 and fluorine 130 pairs. A particular PVDF copolymer is polyvinylidene fluoride trifluoroethylene ("PVDF-TrFE"). The addition of the trifluoroethylene $C_2HF_3$ (essentially substituting a hydrogen with a fluorine) in the chain reduces the overall theoretical electric polarization of a ferroelectric PVDF beta phase chain, but increases the likelihood of forming the ferroelectric beta phase versus the paraelectric alpha phase during crystallization. The crystalline PVDF-TrFE polymer is ferroelectric in that select portions can be given a remanent electric polarization that can be switched in a sufficiently high electric field (i.e., a coercive field). The polarization can be used to store a binary "0" state and a binary "1" state of a memory device fabricated therewith based on the orientation of the polarization.

FIG. 2 illustrates a top view of a single layer polymer ferroelectric memory device. Memory elements utilizing polymer ferroelectric materials can be passive in the sense that there is no need for active components (e.g., a transistor coupled to a MOS capacitor in DRAM). Data is stored by changing the electric polarization of the polymer chain between metal lines that sandwich the layer comprised of the ferroelectric polymer. The elements are driven externally by applying a voltage to the appropriate word and bit lines to read or write to a polymer ferroelectric memory cell. Configured as such, the read cycle is destructive and the memory cell must be rewritten akin to a DRAM refresh cycle.

Specifically, FIG. 2 illustrates bit lines 250–280 and word lines 210–240 sandwiching a layer of polymer ferroelectric material 200. When a voltage is applied across overlapping bit and word lines (e.g., bit line 250 and word line 240) a number of operational processes are possible. A relatively high voltage (e.g., approximately 9 volts) can create a coercive electric field (e.g., approximately 150 MV/m or above) sufficient to program, depending on the orientation of the resulting electric field, a binary "1" state or a binary "0" state. The orientation of the electric field alters the orientation of the remanent electric polarization of the polymer ferroelectric material sandwiched between the bit and word lines. A separate voltage can be applied, in conjunction with external detection circuitry not illustrated, to read the binary state of the memory cell.

Further, the ferroelectric polymer layers can be stacked (e.g., metal word line, ferroelectric polymer, metal bit line, ferroelectric polymer, metal word line, etc.) to improve memory element density. For example, a two-layer system may have a cross-section as follows: first word line metalization, first polymer ferroelectric layer, bit line metalization, second polymer ferroelectric layer, and second word line metalization. Each individual layer can be visualized with reference to FIG. 2. Additional layers can be manufactured by repeating the fabrication pattern. Offsetting the benefits of stacking the layers as noted is the detriment of disturbs. As is well known in the art, and an intrinsic phenomena of memory element arrays, a disturb occurs when reading, erasing, or programming one memory location causes an unwanted alteration in another memory location.

An important step in current ferroelectric polymer fabrication processes is the polymer anneal step. Following a deposition by, for example, spin-coating or evaporation, the polymer layer first undergoes a soft bake to drive out the polymer solvents. The polymer then undergoes an anneal step whereby the polymer is heated to a temperature above its Curie temperature and then cooled. The anneal step crystallizes the polymer to form ferroelectric polymer crystals. Current process technology attempts to maximize the crystallinity (i.e., maximize the ferroelectric properties) of the polymer by altering anneal temperatures, ramp rates, and other related anneal parameters.

As noted, one of the limiting factors of using polymer ferroelectric memory is that the memory exhibits an switching cycle lifespan after which there is sufficient degradation in the polymer's ability to maintains its polarization. Said more simply, after a certain number of switches, the memory will no longer function properly. It is further true that various process anneal steps, or other process steps at which the polymer ferroelectric memory element is exposed to elevated temperatures, degrade the crystallinity of the polymer material and accelerate reactions between the fluoride in the polymer and the, for example, word and bit line metalization. This degradation cannot be recovered and contributes to reducing the useful switching cycle limit of the memory device.

Figure 3A:
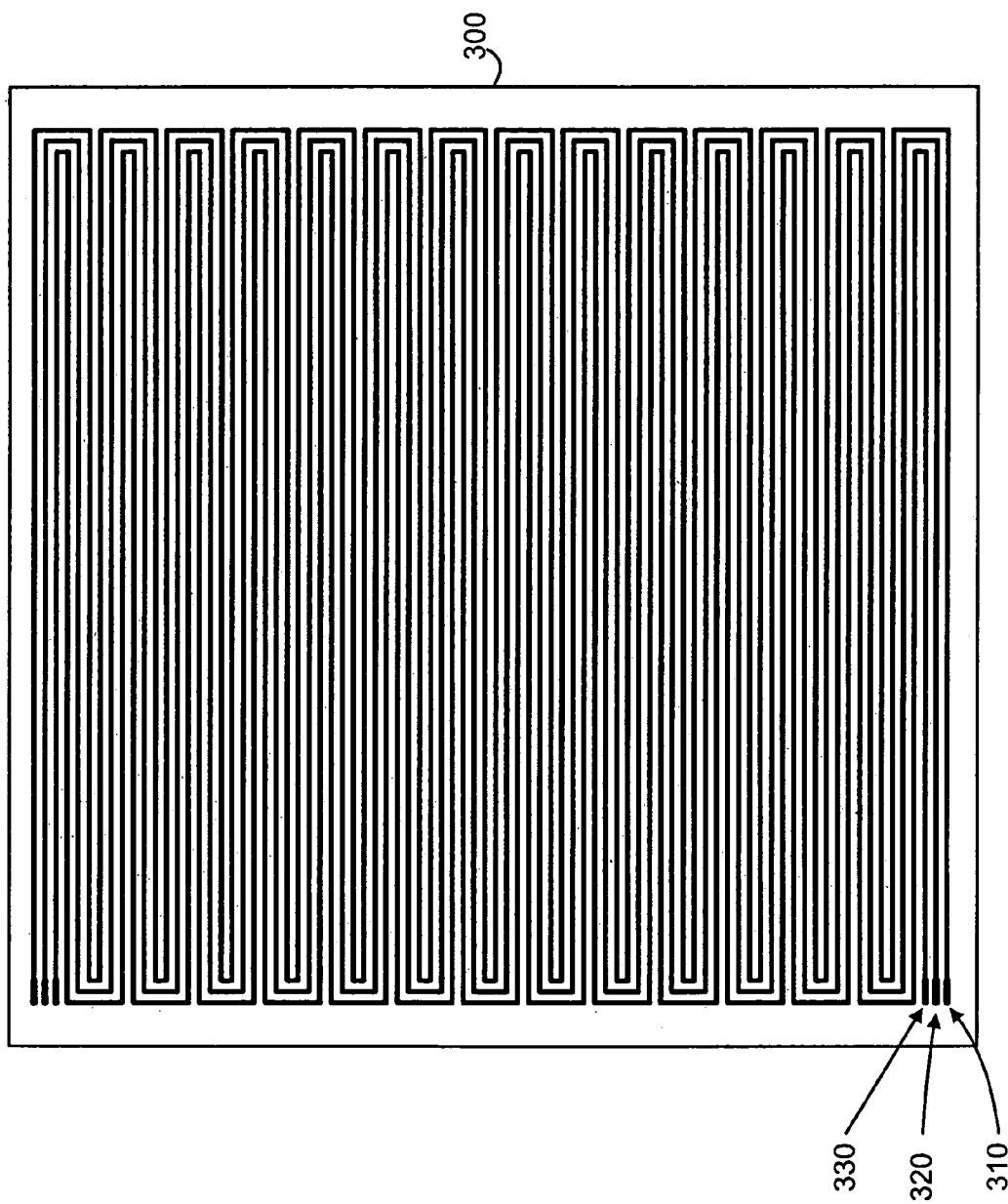
FIG. 3a: illustration of an on-chip heater of an embodiment of the invention.

FIG. 3a illustrates a top view of the on-chip heater of an embodiment of the invention. A heater substrate 300 can be any layer on which it would be useful to create a heater. In an embodiment, the heater substrate 300 is an interconnect or via dielectric layer in, for example, a dual-damascene process architecture as the metal traces 310–330 are fabricated in the top metal interconnect level. Alternatively, the heater substrate 300 may be a dielectric layer. When a current flows through the metal traces, the intrinsic resistance of the metal generates heat. In an embodiment, metal traces 310 and 330 serve as elements through which current is forced to create heat. Metal trace 320 can be used to determine, based on its resistance, the temperature of the heater in conjunction with external temperature detection circuitry or on a calibrated resistance versus temperature database. The precise control of temperature is important to ensure that the Curie temperature of the polymer has been met without elevating the temperature to a point at which the polymer and/or any adjacent process layers would be damaged. In an embodiment, the Curie temperature of the PVDF-TrFE is between 130° C. and 150° C. depending on the exact composition of the PVDF-TrFE copolymer.

Once the heater has raised the temperature of the ferroelectric polymer beyond its Curie temperature (e.g., by forcing a current through metal 310 and 330) it maintains the temperature for a sufficient time period before allowing the polymer to cool and crystallize. In an embodiment, the time period is approximately between 5 and 15 minutes. In an embodiment, the anneal occurs after the polymer ferroelectric device has been fabricated as an initial polymer anneal. In another embodiment, the anneal occurs after a determined number of switching cycles as a refresh anneal.

In an embodiment, an electric field may be created by applying a voltage across the word lines and a bit lines to condition the annealing process. When the heater ceases to generate heat and allows the polymer to cool, an electric field may then be applied. The electric field, if sufficient, coerces the dipole moment of the polymer ferroelectric material to line up with the orientation of the field. When the polymer cools, it will re-crystallize with the dipole orientation depending on the direction of the applied electric field.

Figure 3B:
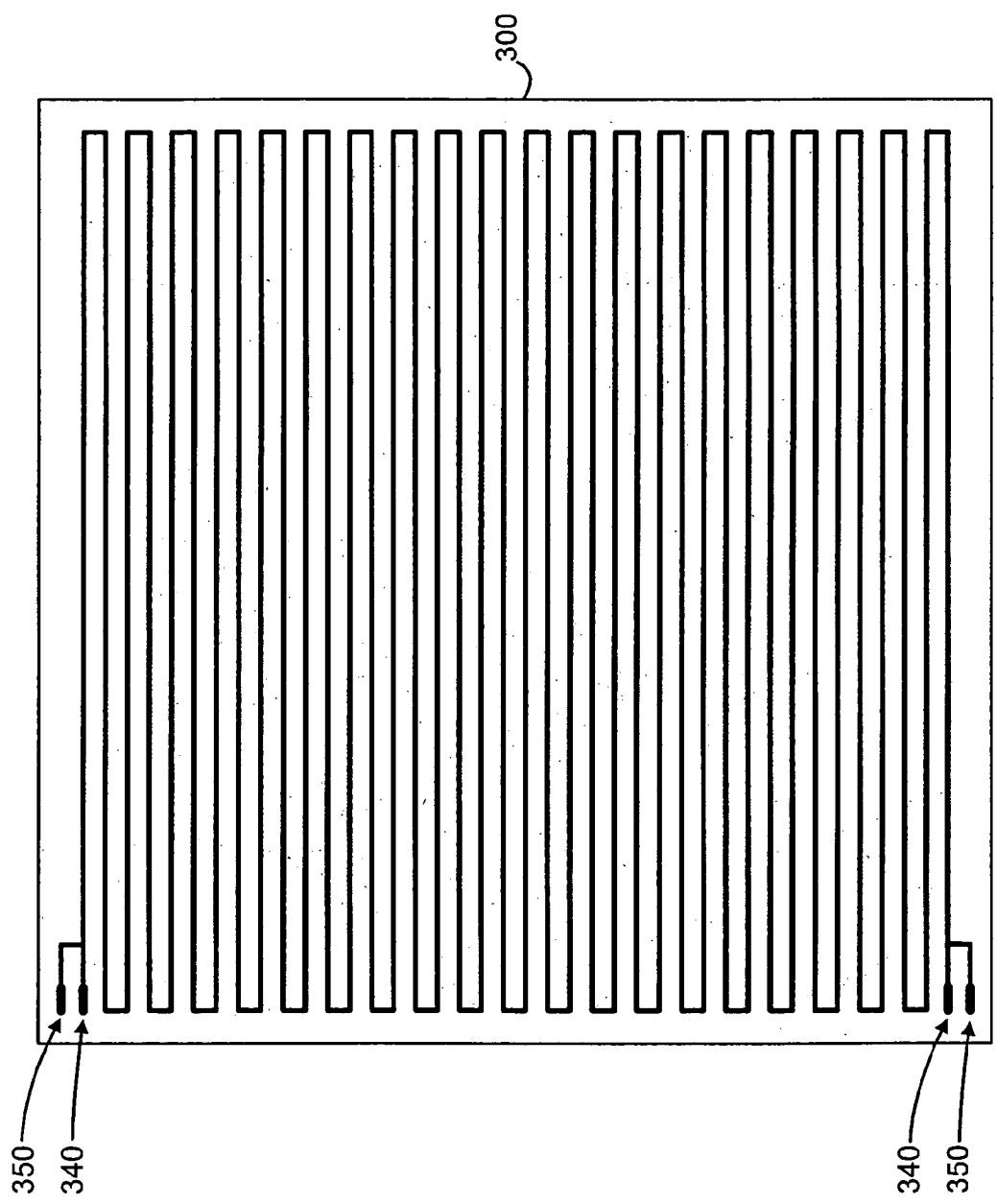
FIG. 3b: illustration of an on-chip heater of an alternate embodiment of the invention.

FIG. 3a further illustrates that the metalization (e.g., metal traces 310–330) can be a dense serpentine pattern created by multiple metal traces. It is to be understood that additional metalization patterns are possible. Requirements include metalization density, uniformity, and the ability to accurately measure resistance to determine temperature. For example, instead of three individual metal traces, there may be only one metal trace as illustrated by FIG. 3b. In such a configuration, metal trace 340 will have an additional pair of contacts. In addition to contact points for the current source, metal trace 340 will have and an additional pair of contacts 350 that can be used to measure the resistance of metal trace 340 to determine the temperature of the heater.

In an embodiment, the heater is laid out with 40 metal traces in parallel. Each metal trace is approximately 8 microns wide with a space of approximately 6 microns to its nearest neighbor. In an embodiment the metal trace resistance is about 300 milliohms/millimeter^2 and the length of each metal trace is approximately 128 mm so the resistance of each metal trace is approximately 4800 ohms. Accordingly, the total resistance of 40 parallel metal traces is approximately 120 ohms. In an embodiment, the heater produces 0.5 watts of power to heat the ferroelectric polymer memory device. Based on the approximate resistance of an embodiment, the heater would require a current of about 65 milliamps created by applying approximately 7.7 volts to generate the 0.5 watts of power. One skilled in the art will recognize that the heater parameters can be scaled as desired by changing the number of lines in parallel, the width of the lines or the sheet resistance of the metal.

Figure 4:
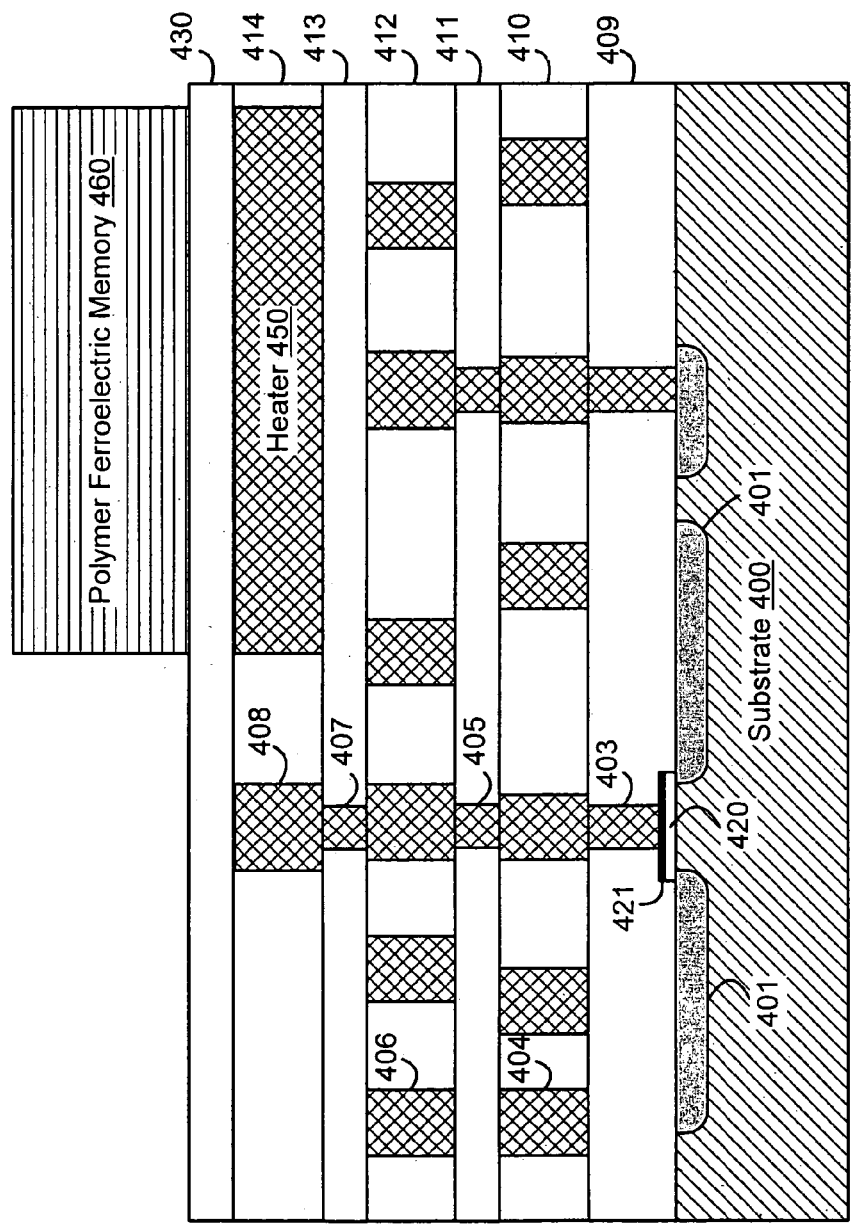
FIG. 4: illustration of a silicon wafer cross section demonstrating integration of a polymer ferroelectric memory device and an on-chip heater of an embodiment of the invention.

FIG. 4 illustrates a cross section of a dual-damascene architecture including a heater 450 of an embodiment of the invention. A substrate 400 contains any variety of semiconductor devices well known to those skilled in the art as represented rudimentarily by source and drain regions 401, dielectric 420, and gate 421 of a metal oxide semiconductor ("MOS") transistor. Interconnect levels 404, 406, and 408 are representative of, for example, the trench level of a dual-damascene interconnect structure, for which via levels 403, 405, and 407 provide electrical contact between interconnect layers and between interconnect layers and semiconductor devices. LD layers 409 through 414 are formed of, for example, a low-k dielectric material. The ILDs not only isolate interconnects on different layers, but also isolate interconnects on the same layer. It is to be understood that there may be more or fewer interconnect levels depending on the nature and complexity of the fabricated devices as is well known in the art.

A heater 450 has been included in the last interconnect level (i.e., the same metal layer as interconnect trench 408). In an embodiment, the heater 450 has a top view as illustrated by FIG. 3a or 3b and function as described above. A dielectric layer 430 has been deposited on top of the ILD 414, interconnect trench 408, and heater 450 to isolate the polymer ferroelectric memory device 460 from the metalization of the heater 450.

To fabricate the heater 450, ILD 414 material is deposited by, for example, spin-coating or chemical vapor deposition. ILD 414 is then photolithographically patterned and etched, with techniques well known in the art, to create, among other features, the heater 450 metal topography, the top view of which is illustrated by FIG. 3a or 3b. The heater 450 metal is deposited using any technique know in the art (e.g., physical vapor deposition or electron beam evaporation) and planarized by, for example, chemical mechanical polishing, to create the metal pathways of heater 450, the individual lines of which are isolated by ELD 414 material. The heater 450 can then be coupled to and controlled by an energy source (not illustrated) in response to a temperature sensor or resistance versus temperature database to heat the polymer ferroelectric memory device 460 to a desired temperature.

Figure 5:
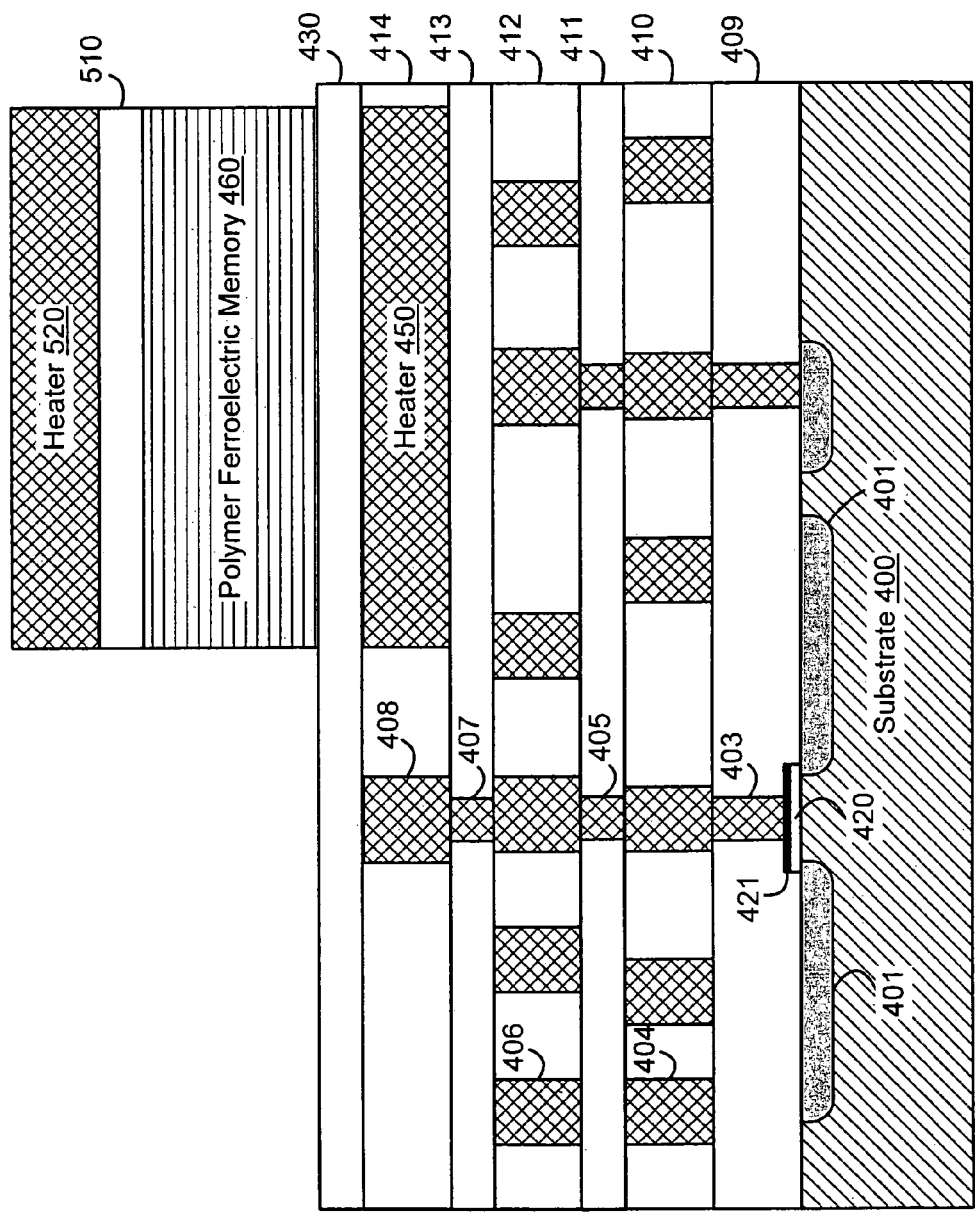
FIG. 5: illustration of a silicon wafer cross section demonstrating integration of a polymer ferroelectric memory device and an on-chip heater and of an alternative embodiment of the invention.

FIG. 5 illustrates that a heater 520 of an embodiment of the invention can also be formed on top of the polymer ferroelectric memory device 460. Heater 520 may be the only heater, or it may be used in conjunction with heater 450 to heat the polymer ferroelectric memory device 460 from both above and below. The combination of heater 450 with heater 520 can more uniformly heat, for example, a polymer ferroelectric memory device 460 that has many word line, polymer, and bit line layers.

In an embodiment, heater 520 is fabricated using a subtractive metal processing flow as is well known in the art. For example, a dielectric layer 510 is deposited atop the polymer ferroelectric memory device 460 to isolate the top electrode of the polymer ferroelectric memory device 460 from the heater 520 metal. In an embodiment, the dielectric layer 510 is silicon dioxide ($SiO_x$) deposited with low temperature, plasma-enhanced chemical vapor deposition. The dielectric layer 510 is then planarized utilizing known chemical mechanical polishing techniques to a thickness of approximately 5000 angstroms. A metal, for example aluminum or copper, can be deposited using any known metal deposition technique. In an embodiment, the metal is sputter deposited with an IMAT Endura sputter deposition tool. The metal is then patterned to create, for example, the metal pattern as illustrated by FIG. 3a or 3b. In an embodiment, the heater 520 metal thickness is approximately 3000 angstroms.

The metal layer of heater 520 is the same metal layer that forms the contact between the polymer ferroelectric memory device 460 and the, for example, active CMOS devices fabricated on substrate 400. As the cells of the polymer ferroelectric memory device 460 are, in general, accessed from word line and bit line contacts external to the polymer ferroelectric memory device 460 array, the real estate atop the polymer ferroelectric memory device 460 is, in an embodiment, available to fabricate the heater 520 without adding process steps past those necessary to create the contacts between the polymer ferroelectric memory device 460 and the underlying CMOS devices of substrate 400.

The importance of on-chip heater of an embodiment of the invention is two-fold. As noted, annealing steps during wafer processing degrade the ferroelectric properties of the polymer given that the fluoride contained in the polymer reacts with adjacent metal layers (e.g., the word lines and bit lines). The damage to the crystalline polymer chain based on the fluoride-metal reaction cannot be undone. The on-chip heater can in situ anneal in, for example, one initialization anneal what may have to be annealed with multiple external anneals otherwise. Utilizing the on-chip heater to in situ initially anneal reduces the number of times the ferroelectric polymer is exposed to elevated temperatures. Reducing the number of anneals reduces the extent to which the polymer is damaged by interaction with adjacent metal layers.

The second benefit of the on-chip heater of an embodiment of the invention is the ability to refresh the crystalline polymer ferroelectric material to restore its ferroelectric properties following a certain number of switch cycles. The refresh anneal can be performed any number of times over the life of the polymer ferroelectric memory as the memory approaches its fatigue limit based on switching cycles. The in situ refresh anneal that re-crystallizes the polymer ferroelectric material can occur in an end-user product after a certain number of switching cycles or lapse of a certain amount of time. For example, a refresh anneal can be performed following approximately 10 million switching cycles or approximately 7 years of lifetime. Either the number of switching cycles of lapse of time would incorporate a safety factor to ensure the polymer ferroelectric memory is refreshed before substantial degradation has occurred.

One skilled in the art will recognize the elegance of the disclosed embodiment in that it mitigates one of the limiting factors of implementing ferroelectric memory devices by in situ annealing polymer ferroelectric material to initially crystallize the polymer and/or to refresh fatigued polymer.

What is claimed is:

1. An apparatus comprising:
   a polymer ferroelectric memory device; and
   a heater coupled to the polymer ferroelectric memory device to heat the polymer ferroelectric memory device, wherein the heater comprises at least a portion of a layer within the polymer ferroelectric memory device.

2. The apparatus of claim 1 further comprising:
   a temperature detector coupled to the heater to detect the temperature of the heater.

3. The apparatus of claim 2 wherein the temperature detector is an on-chip temperature sensor.

4. The apparatus of claim 2 wherein the heater further comprises:
   a metal array; and
   a current source coupled to the metal array to supply current to the metal array to generate heat.

5. The apparatus of claim 4 wherein the metal array has a serpentine pattern.

6. The apparatus of claim 5 wherein the metal array further comprises:
   a plurality of non-intersecting metal traces wherein at least one metal trace is coupled to the temperature detector and the other metal traces are coupled to the current source.

7. The apparatus of claim 5 wherein the metal array further comprises:
   a non-intersecting metal trace; and
   a plurality of contact pairs coupled to the non-intersecting metal trace wherein one contact pair is coupled to the temperature detector and another contact pair is coupled to the current source.

8. The apparatus of claim 1 wherein a polymer of the polymer ferroelectric memory device is polyvinylidene fluoride.

9. The apparatus of claim 1 wherein a polymer of the polymer ferroelectric memory device is a polyvinylidene fluoride trifluoroethylene copolymer.

10. The apparatus of claim 1 further comprising a dielectric layer coupled to and between the polymer ferroelectric memory element and the heater to electrically isolate the polymer ferroelectric memory element from the heater.

11. A method comprising:
    heating, with an on-chip heater, a ferroelectric polymer to a temperature above its Curie temperature, wherein the heater comprises at least a portion of a layer within the polymer ferroelectric memory device;
    maintaining the temperature for a time period;
    cooling the ferroelectric polymer to crystallize the ferroelectric polymer.

12. The method of claim 11 further comprising:
    exposing the ferroelectric polymer to an electric field as it cools from the temperature above its Curie temperature.

13. The method of claim 11 further comprising:
    detecting, with a temperature detector, the temperature of the on-chip heater.

14. The method of claim 11 wherein the ferroelectric polymer comprises a polymer ferroelectric memory device.

15. The method of claim 11 wherein the ferroelectric polymer is polyvinylidene fluoride.

16. The method of claim 11 wherein the ferroelectric polymer is a polyvinylidene fluoride trifluoroethylene copolymer.

17. The method of claim 11 wherein the Curie temperature is approximately between 130° C. and 150° C.

18. The method of claim 17 wherein the Curie temperature is approximately 135° C.

19. The method of claim 11 wherein the time period is approximately between 5 and 15 minutes.

20. The method of claim 19 wherein the time period is approximately 10 minutes.

21. A method comprising:
    annealing, with an on-chip heater, a polymer ferroelectric memory device.

22. The method of claim 21 wherein annealing the polymer ferroelectric memory device further comprises:
    heating, with the on-chip heater, the polymer ferroelectric memory device to a temperature above the Curie temperature of a ferroelectric polymer;
    maintaining the temperature for a time period;
    cooling the polymer ferroelectric memory device to crystallize the ferroelectric polymer.

23. The method of claim 22 further comprising:
    exposing the ferroelectric polymer to an electric field as it cools from the temperature above its Curie temperature.

24. The method of claim 22 further comprising:
    detecting, with a temperature detector, the temperature of the on-chip heater.

25. The method of claim 22 wherein the ferroelectric polymer is polyvinylidene fluoride.

26. The method of claim 22 wherein the ferroelectric polymer is a polyvinylidene fluoride trifluoroethylene copolymer.

27. The method of claim 22 wherein the Curie temperature is approximately between 130° C. and 150° C.

28. The method of claim 27 wherein the Curie temperature is approximately 135° C.

29. The method of claim 22 wherein the time period is approximately between 5 and 15 minutes.

30. The method of claim 29 wherein the time period is approximately 10 minutes.

31. The method of claim 22 wherein annealing the polymer ferroelectric memory device further comprises:
    initializing the polymer ferroelectric memory device.

32. The method of claim 22 wherein annealing the polymer ferroelectric memory device further comprises:
    refreshing the polymer ferroelectric memory device.

* * * * *

UNITED STATES PATENT AND TRADEMARK OFFICE
CERTIFICATE OF CORRECTION

PATENT NO. : 7,173,842 B2  Page 1 of 1
APPLICATION NO. : 10/816260
DATED : February 6, 2007
INVENTOR(S) : Isenberger et al.

It is certified that error appears in the above-identified patent and that said Letters Patent is hereby corrected as shown below:

In column 5, at line 30, delete "LD" and insert --ILD--.

In column 5, at line 55, delete "ELD" and insert --ILD--.

Signed and Sealed this

Fifteenth Day of April, 2008

JON W. DUDAS
*Director of the United States Patent and Trademark Office*